(12) United States Patent
Booth et al.

(10) Patent No.: US 10,934,635 B2
(45) Date of Patent: Mar. 2, 2021

(54) METHOD FOR TRAPPING VACANCIES IN A CRYSTAL LATTICE

(71) Applicant: OXFORD UNIVERSITY INNOVATION LIMITED, Oxford Oxfordshire (GB)

(72) Inventors: Martin James Booth, Oxford (GB); Patrick Salter, Oxford (GB); Jason Smith, Oxford (GB); Yu-Chen Chen, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 0 days.

(21) Appl. No.: 15/740,340

(22) PCT Filed: Jul. 1, 2016

(86) PCT No.: PCT/GB2016/052004
§ 371 (c)(1),
(2) Date: Dec. 27, 2017

(87) PCT Pub. No.: WO2017/006092
PCT Pub. Date: Jan. 12, 2017

(65) Prior Publication Data
US 2018/0187333 A1    Jul. 5, 2018

(30) Foreign Application Priority Data
Jul. 3, 2015    (GB) .................................... 1511677

(51) Int. Cl.
*C30B 33/04*    (2006.01)
*C30B 29/04*    (2006.01)
(Continued)

(52) U.S. Cl.
CPC .............. *C30B 33/04* (2013.01); *C30B 25/10* (2013.01); *C30B 29/04* (2013.01); *C30B 33/02* (2013.01)

(58) Field of Classification Search
CPC ....... Y02P 20/152; C30B 25/10; C30B 29/04; C30B 33/02; C30B 33/04
See application file for complete search history.

(56) References Cited

U.S. PATENT DOCUMENTS

2006/0196858 A1* 9/2006 Barron .................. A44C 17/00
                                                                  219/121.69
2010/0140630 A1* 6/2010 Hamaguchi ......... H01L 33/0095
                                                                  257/79
(Continued)

FOREIGN PATENT DOCUMENTS

EP    1990313 A1    11/2008
GB    2497660 A      6/2013
(Continued)

OTHER PUBLICATIONS

Liu et al., optics express, vol. 21, No. 10, 12843-12848, 2013 (Year: 2013).*
(Continued)

*Primary Examiner* — Hua Qi
(74) *Attorney, Agent, or Firm* — McDonnell Boehnen Hulbert & Berghoff LLP

(57) ABSTRACT

There is provided a method of fabricating a trapped vacancy in a crystal lattice of a target comprising: positioning the target in a laser system, the target containing vacancy trapping elements within the crystal lattice; modifying the crystal lattice within the target by using a laser to generate a lattice vacancy; and annealing the target to cause the lattice vacancy to migrate and be captured by a vacancy trapping element to form the trapped vacancy in the crystal lattice.

26 Claims, 5 Drawing Sheets

(51) Int. Cl.
    *C30B 33/02*     (2006.01)
    *C30B 25/10*     (2006.01)

(56)           References Cited

U.S. PATENT DOCUMENTS

2010/0271016 A1    10/2010    Barclay et al.
2014/0170333 A1*    6/2014    Mazur .................. B23K 26/34
                                                      427/555

FOREIGN PATENT DOCUMENTS

JP              H0648892 A        2/1994
WO         2010/149775 A1    12/2010
WO    WO-2010149775 A1 *  12/2010  ............ C30B 25/02

OTHER PUBLICATIONS

Liu et al., Optics Express, vol. 21, No. 10, May 20, 2013, pp. 12843-12848 (Year: 2013).*
Dingwei Zheng "Study and manipulation of photoluminescent NV color center in diamond", École normale supérieure de Cachan—ENS Cachan, 2010. English. <NNT: 2010DENS0031>. (Year: 2011).*
The International Search Report (ISR) with Written Opinion for PCT GB2016/052004 dated Dec. 16, 2016, pp. 1-16.
Liu, Yan et al., "Fabrication of nitrogen vacancy color centers by femtosecond pulse laser illumination" Optics Express (2013) vol. 21 (17), pp. 12843-12848.
Search Report from the United Kingdom Intellectual Property Office (UKIPO) for GB1511677.5 dated Jan. 14, 2016, pp. 1-4.

* cited by examiner

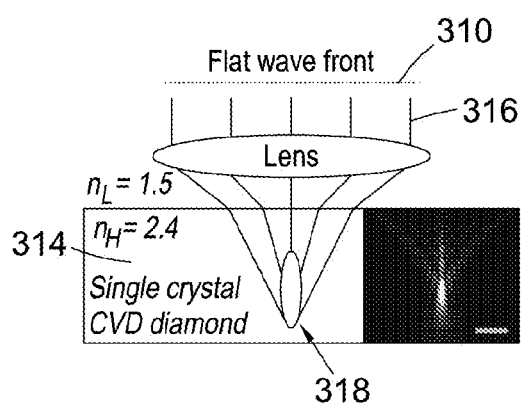
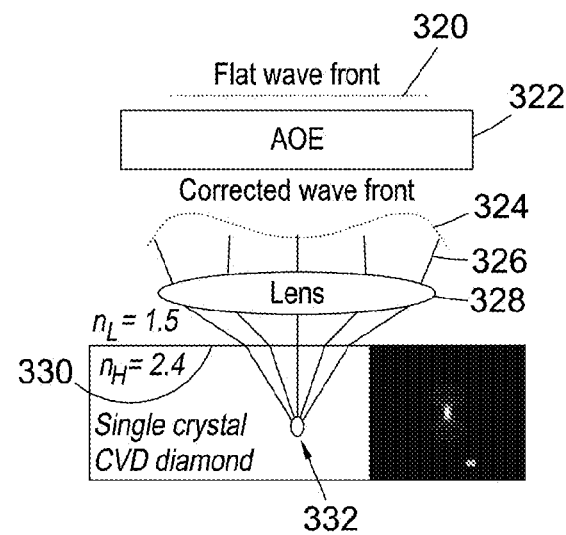
Fig. 3A        Fig. 3B
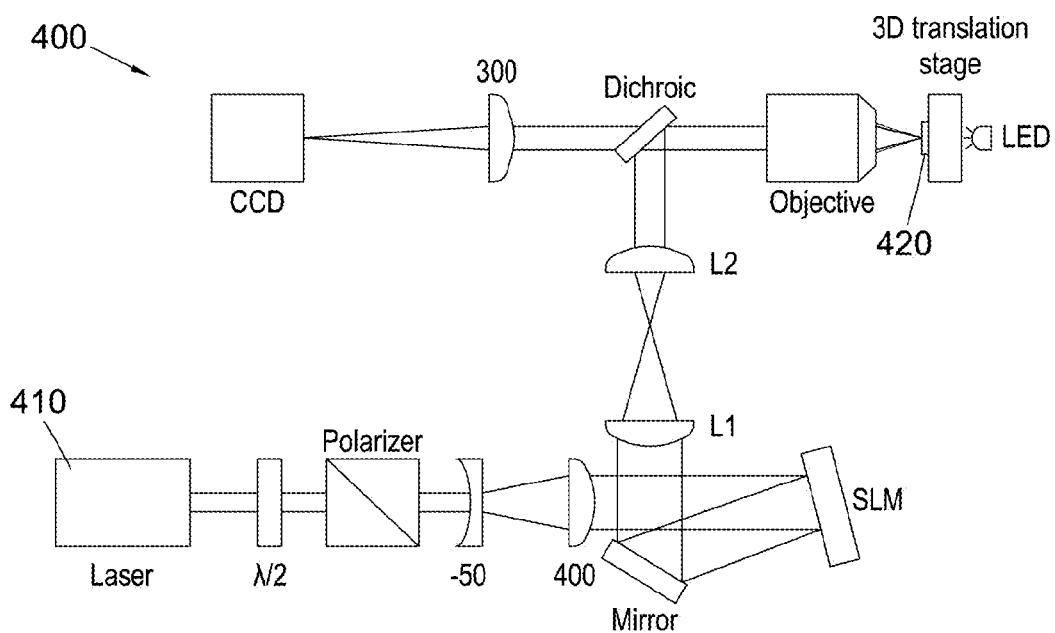
Fig. 4

METHOD FOR TRAPPING VACANCIES IN A CRYSTAL LATTICE

The present application is a section 371 U.S. patent application claiming priority to PCT/GB2016/052004, filed Jul. 1, 2016, which claims priority from GB Application No. 1511677.5, filed Jul. 3, 2015, the contents of which are hereby incorporated by reference.

The invention relates to crystal defects, and more particularly to a method of modifying a crystal lattice.

BACKGROUND

Optically active point defects (also known as colour centres) in crystals can be used for a range of device applications from sensing to telecommunications and information storage/processing.

Point defects in e.g. diamond have a number of potential applications in information technologies. They can be used as sensors of magnetic fields, electric fields, and temperature, providing both extremely low detection limits and spatial resolution at the nanometre scale; as quantum memory registers in which information is stored as quantum superpositions for time durations sufficient to perform computation; and as sources of single photons of light for use in quantum communications and applications where sub-Poissonian noise levels are required.

One of these defects, for which the aforementioned applications have been identified, is the nitrogen-vacancy centre, which constitutes a substitutional nitrogen atom and adjoining vacancy along the [111] bond axis of the giant tetrahedral crystal in diamond.

Many of the properties of the defects are generic and other defects are potentially interesting and useful for similar applications. The properties that are general to diamond include:
(i) Environmental robustness—diamond is a hard and inert material which allows stable and durable devices to be made.
(ii) Biocompatibility—diamond is completely biocompatible, as it consists entirely of carbon.
(iii) Low thermal noise—many applications are sensitive to thermal noise in the form of lattice vibrations. Diamond has a Debye Temperature of approximately 2200K so that thermally induced lattice vibrations are much lower than in other materials at room temperature.
(iv) Low magnetic noise—many applications are sensitive to magnetic noise caused by random reorientation of electronic and nuclear spins in the lattice. Diamond has an extremely wide band gap of 5.5 eV so that the free carrier density at ambient temperatures is negligible. Naturally occurring diamond also has very few nuclear spins as it is predominantly (approximately 99%) $^{12}C$ isotope which has a spin 0 nucleus. The material can be grown with increased isotopic purity to further reduce the magnetic noise in the lattice. High chemical purity and low defect levels are also important as these provide sites for unpaired electrons which create magnetic fields via their spin.
(v) Point defects have highly localised electron states deep within the band gap that provide atom-like behaviour that is relatively decoupled from residual lattice perturbations.

Most point defects involve lattice vacancies. Nitrogen-vacancy, silicon-vacancy, and germanium-vacancy defects each have a single (intact or split) vacancy as part of their structure. Other defects include multiple vacancies or require the presence of vacancies to enable impurity diffusion during formation. Controlled generation of vacancies in the lattice is therefore of great value for generating a wide range of defects in a controlled way, particularly when combined with the presence of other impurities in the diamond lattice.

Other materials such as silicon carbide, silicon, and garnet crystals also reveal colour centres that, whilst at an earlier stage of development, may be similarly useful in information applications.

An example of a colour centre with technological promise is the nitrogen-vacancy (NV) centre. The NV centre has two known charge states, the neutral state $NV^0$ and the singly negatively charged state $NV^-$. The $NV^-$ defect possesses a spin triplet ground state, and an electronic structure that provides strong spin-preserving electric dipole transitions in the visible region of the spectrum, which allow both optical pumping and measurement of the spin state of the defect. In the past decade an increasing literature has developed around the use of $NV^-$ defect in quantum optics, quantum sensor and quantum computing applications.

NV centres are found in natural diamond and can also be formed in synthetic material either during the crystal growth process or created after crystal growth is complete. For many of the aforementioned applications it may be desirable to exercise control over the position of the NV centres in the crystal, the number of NV centres formed (often requiring individual NV centres within an addressable volume), and the properties of the NV centres. For this reason it may be advantageous to create the NV centres post crystal growth.

The steps by which NV centres are usually created in a diamond lattice are firstly to ensure the presence of sufficient substitutional nitrogen atoms, which are present already or need to be added by ion implantation; secondly to ensure the presence of vacancies (which have been created by e.g. ion implantation), and then to anneal the diamond at a temperature of more than 800 degrees Celsius, so that the vacancies become mobile and diffuse through the lattice. When the diffusing vacancy encounters a substitutional nitrogen atom it can form an energetically stable NV centre. Similar processes apply to other vacancy-related defect centres, whereby implantation of a suitable ion or combination of ions is combined with vacancy generation and annealing to create stable complexes in the lattice.

Previously, vacancy creation has been carried out either by electron irradiation or by an ion implantation process. These methods create lattice damage from the point of entry to a maximum depth below the surface, since damage is created via the collision of the particles with the lattice atoms and the particles lose energy gradually as they penetrate the lattice. These collisions also divert the particles from their paths, and as a result the vacancies may be created in locations other than those intended. It is generally found with ion implantation that most lattice damage occurs near to the maximum penetration depth, due to the average trajectory of the heavy implanted ions as they lose kinetic energy upon penetration. This provides a degree of control over the location of induced vacancies, but in most cases (particularly when creating NV centres more than a micrometre or so beneath the surface) the process creates far more lattice damage than is desirable to produce vacancies for formation of colour centres. High temperature annealing can remove some, but not all of the residual lattice damage—NV centres are stable up to about 1450 degrees Celsius, and most extended vacancy defects created by the implantation process are destroyed at temperatures above about 1000 degrees Celsius. However, any colour centres that are created are typically surrounded by extensive lattice damage, which then undesirably affects the properties of the colour centre. Therefore, the creation of NV centres with properties equal to those that occur during the crystal growth process cannot be achieved using these prior art methods.

An additional limitation of the previously used methods for NV generation is that they do not enable creation of isolated NV centres deep inside a crystal, since the nitrogen implantation can only reach a few micrometres (with MeV implantation energies), and e-beam irradiation provides no depth control for vacancy generation. Higher energy methods result in an increase in collateral damage to the lattice.

Similar methods can be envisaged in the creation of other vacancy-incorporating defects such as the silicon-vacancy centre.

The presence of vacancies in the crystal is an element in the formation of many defects, and so the controlled generation of vacancies can be key to controlling defect formation for device processing.

SUMMARY OF INVENTION

According to the present specification there is provided, in broad terms, a method for modifying a crystal lattice comprising: modifying the crystal lattice at a controlled position in a target using a laser; and annealing the crystal lattice to form a desired feature in the crystal.

The modifying of the crystal lattice includes locally damaging the crystal lattice through the interaction of an optical pulse from the laser such that the structure of the crystal lattice is altered. This is through the creation of one or more vacancies. In some instances the damage may be greater and result in the lattice adopting a modified crystalline or amorphous structure. In all cases the damage is "local" in the sense of being confined to the region of interaction of the optical pulse. In general, this will correspond to a volume of width less than 1 micrometre, more preferably less than 500 nanometres (nm), and more preferably still less than 250 nm. In most preferred arrangements, the damage extends a distance in any direction of less than 150 nm and may even be of the order of around 100 nm or less.

According to a first aspect of the present invention, there is provided a method of fabricating a trapped vacancy in a crystal lattice of a target comprising: positioning the target in a laser system, the target containing vacancy trapping elements within the crystal lattice; modifying the crystal lattice within the target by using a laser to generate a lattice vacancy; and annealing the target to cause the lattice vacancy to migrate and be captured by a vacancy trapping element to form the trapped vacancy in the crystal lattice.

The creation of vacancies in the crystal in a controlled manner can enable control over the creation of colour centres, and can allow the engineering of lattice strain in the material to modify colour centre properties. The invention may therefore be seen to concern the use of laser processing to create lattice vacancies for the production and engineering of devices based on colour centres. One embodiment focuses on nitrogen-vacancy centres (NV) in diamond (for which the method has been demonstrated experimentally), but the method is also applicable to other defects and other crystalline materials. The method includes laser processing followed by annealing to create single NV centres in desired locations within a crystal lattice, preferably diamond.

The method may include modification of the crystal lattice via nonlinear multi-photon absorption.

The method may include using a pulsed laser. The method may include operating the laser at a central wavelength where the expected energy of an absorbed photon would be less than the bandgap of the target, operating the laser at an output that would not be expected to cause damage to the target by linear single photon absorption. That is, the absorption of energy from the laser by the crystal lattice may be nonlinear and may be the result of simultaneous absorption of the energy of multiple photons, so that the total energy of the absorbed photons is approximately equal to the energy of the bandgap.

The size of the region of the target to be modified may therefore be reduced to that region only where the intensity of the laser is sufficient to cause nonlinear absorption. Since nonlinear absorption typically requires higher intensities than linear absorption, the region of the crystal lattice to be modified can be constrained to only the highest intensity region of the laser. Modification of the crystal lattice may include second-order, third-order, fourth-order, or higher-order nonlinear multi-photon absorption in the crystal lattice.

The pulse energy of the laser entering the crystal may be less than 15 nJ. Above this level the pulse energy can be seen to inflict too much damage to the crystal lattice.

In preferred arrangements the method may include the pulse energy of the laser entering the crystal being greater than 2 nJ. A minimum level of pulse energy may be required to reliably inflict the desired damage in the crystal lattice.

The pulse energy of the laser entering the crystal may be between 9 nJ and 14 nJ, and in particular instances may be between 10 nJ and 12 nJ. These energies may be substantially less than the energies typically used to modify crystal lattices. For example, a typical energy used for modifying diamond might be 100 nJ, and may be used when e.g. fabricating graphitic wires in diamond. Therefore, the present method may be considered as using significantly lower pulse energies than other known methods for modifying crystal lattices. A result of the low pulse energies of the present method may be that no visible modification is caused to the crystal lattice, for example, in the case of a diamond target, there may be no visible indications of graphitic damage.

The method may include using a target where the vacancy trapping elements are present at a concentration of less than about 1 part per million, and more preferably, may further include the vacancy trapping elements being present at a concentration of less than about 5 parts per billion. The target may have approximately 200 vacancy trapping elements per cubic micron.

As a guide, the method may include selecting a target which has a concentration of trapping elements that is high enough that the generated vacancy will likely be captured during annealing close to its point of generation, whilst being low enough that the properties of the crystal lattice itself are not affected in an undesired manner.

The method may include the vacancy trapping element being nitrogen. The engineered nitrogen-vacancies created by the present method, particularly in a diamond target, have properties that make them promising as useful devices for sensors and the like having engineered trapped vacancies. The vacancy trapping element could also be other elements such as silicon, or germanium. The method may comprise fabricating nitrogen-vacancies, silicon-vacancies or germanium-vacancies, and any combination thereof, and may include using vacancy trapping elements other than nitrogen, silicon and germanium. Such vacancy trapping elements may be any impurity, either naturally occurring in the crystal lattice, deposited during crystal growth, diffused, implanted, or however so placed in the crystal.

In one embodiment, the target may comprise diamond. Diamond has desirable properties mentioned above, such as being durable and relatively chemically inert, as well as being biocompatible and having low thermal and magnetic noise. The method may include selecting a target of diamond, silicon, or silicon carbide, and any combination thereof. Other targets having other crystal lattices may also be used.

The method may include the vacancy trapping elements being deposited during fabrication of the target, and may further include the target being fabricated using chemical vapour deposition (CVD). The concentration of vacancy trapping elements may be that which occurs during high-purity CVD fabrication and therefore may not require any special fabrication steps. Alternatively, the concentration may require doping of the crystal lattice during fabrication, or may allow lower purity targets to be used. Vacancy trapping elements may be printed during deposition of the crystal.

The vacancy trapping elements may be evenly distributed throughout the target material, and therefore each region of the target may have an approximately equal likelihood of trapping a migrating vacancy during annealing. Alternatively, the vacancy trapping elements may be intentionally more concentrated in some areas of the target than others, so that a particular region with a greater concentration of vacancy trapping elements has an increased likelihood of trapping a migrating vacancy, as compared to a region of the target with a lower concentration of vacancy trapping elements. It may be desirable to concentrate the vacancy trapping elements in a central region of the target, in array positions, or in a pattern that when combined with a vacancy is beneficial for an optical or other device. Therefore, fabrication of the target material may require special fabrication to increase or decrease the concentration of vacancy trapping elements in particular desired regions.

The method may include the trapped vacancy forming part of a colour centre, and may preferably include the colour centre being a nitrogen-vacancy colour centre (NV). The colour centre may be a silicon-vacancy or a germanium vacancy. Other colour centres are also envisaged.

The method includes the step of modifying the crystal lattice by directing a focused laser to a specific region in the target. Therefore, desired regions of the crystal lattice may be modified. These desired regions may have increased or decreased vacancy trapping element concentrations relative to the bulk material. The desired regions may have particular locations relative to other trapped vacancies, modified crystal lattice regions, or target regions. The method may comprise determining a desired position for the trapped vacancy and focusing the laser at that position in order to carry out the step of modifying the crystal lattice.

The method may include modifying a wavefront of the laser to cancel aberrations in the laser caused by the refractive index of the target. Modification of the wavefront of the laser may be done using a spatial light modulator, a deformable mirror, and a membrane deformable mirror, or any combination thereof. Alternatively, or in addition, modification of the wavefront of the laser may be done using a phase mask, which may be pre-engineered for a particular apparatus suitable for carrying out the method. Using such a mask, an apparatus may be configured for bulk-manufacture of targets with fabricated trapped vacancies. Other means of modifying the wavefront to cancel aberration of the focus may be used.

The method can include modifying the region of the crystal lattice at any position, or any combination of positions, in the target. The method may include modifying the crystal lattice adjacent the surface of the target, and/or may include modifying the crystal lattice adjacent the edges of the target, and/or adjacent the rear surface of the target.

The step of modifying the crystal lattice may include modifying the crystal lattice selectively at a depth of greater than 5 microns. The method may include modifying the crystal lattice at a depth of greater than 10 microns, or a depth of greater than 100 microns from the target surface, and may include modifying the crystal lattice at a depth greater than 500 microns from the surface. Particularly, the effects of aberration caused by refraction of the light by the target's surface can be cancelled, and aberration-free focusing of the laser can be achieved at increased depths beneath the surface of the target.

The method may not affect or modify a region of the target except at the desired focus, and may not affect or modify the surface of the crystal, since the location of the focus may be controlled and the intensity at the surface of the target may be too low to cause modification. The optical properties of the target may remain unchanged throughout the target except where the trapped vacancy is fabricated.

The method may include the step of selecting a pulse energy (PE) of the laser relative to a modification threshold (MT) of the target in order to reduce the effective beam area for modifying the crystal lattice. In other words, the method may include a step of identifying the pulse energy where, below which no modification of the crystal lattice can be observed, e.g., by using a range of different pulse energies in different positions, investigating the target and determining a threshold where modification of the crystal lattice starts to be seen. Preferably, a modification threshold (MT) may be determined and a pulse energy (PE) may be selected such that $0.9\ MT<PE<1.3\ MT$. In this way, only the highest intensity region of the laser will have sufficient energy to modify the crystal lattice in the desired manner, and the spatial extent of the modified region will be confined to the highest intensity region. Therefore, lattice vacancies may be generated with increased precision.

The modified region of the crystal lattice may have a size of less than 200 nm. Preferably, the modified region of the crystal lattice may be smaller than 100 nm. Therefore, the localisation of the fabricated trapped vacancy may be controlled to within about 500 nm and more preferably within 350 nm or even 250 nm. In some instances, it may be possible to achieve a reasonable production rate where the fabricated trapped vacancy is controlled to within about 200 nm, 150 nm or more preferably 100 nm, corresponding to roughly the size of the modified region.

The pulse duration may be shorter than the characteristic timescale for thermal diffusion in the target, so that the loss of energy as heat may be reduced. The duration of the laser pulse may be between 1 attosecond and 1 second. The laser may be a picosecond or femtosecond laser. The duration of the pulse generated by the laser may be about 80 fs, and/or preferably the pulse duration in the target may be about 300 fs. Other pulse durations may be used and may be more suitable for a particular apparatus or targets.

The method may comprise forming a two-dimensional or three-dimensional array or pattern of trapped vacancies in the crystal lattice of the target. A two-dimensional array may be a two-dimensional grid of isolated trapped vacancies spaced periodically from one another. The three-dimensional array may be a three-dimensional grid of isolated trapped vacancies spaced periodically from one other. The array or pattern may be any desired array or pattern in two or three dimensions, and may have regular or irregular spacing between the trapped vacancies. Further, the array may have regular spacing in one dimension and irregular spacing in another dimension, or any combination of regular and irregular spacing.

The method may include strain engineering of the trapped vacancy, for example, by the other aspect of the invention described below. The method may comprise modifying the lattice so as to engineer the strain field about at least one specific trapped vacancy in order to modify its properties. Lattice strain can affect the properties of trapped vacancies, and the precision of the techniques described herein may allow the strain at a particular point in the lattice to be controlled in a predetermined way, thereby engineering the strain at a particular trapped vacancy.

The method comprises annealing the target to cause the fabricated vacancies to migrate and be captured by a vacancy trapping element. The step of annealing may comprise heating the target to between 800-1400° C. for a period of between 15 minutes to 24 hours in a vacuum. Preferably, the step of annealing may comprise heating the target to about 900° C. for about 3 hours in a vacuum.

Annealing the target allows the migration of the vacancies, but may also heal those vacancies which do not become trapped, thereby regenerating the crystal lattice and leaving only the fabricated trapped vacancies. The purpose of annealing the target may therefore be twofold—causing the vacancies to migrate, and healing vacancies that are not trapped by a vacancy trapping element.

The method may comprise fabricating an isolated trapped vacancy, and repairing damage to the crystal lattice about that trapped vacancy. The method may comprise controlling the laser operation so that the target is free of damage in a region around and/or adjacent the trapped vacancy following annealing. Controlling the laser operation may include controlling the location of the laser focus, the size of the laser focus, the intensity, power, phase, and/or duration of the laser.

The step of annealing may include covering the target with a protective coating. The protective coating my comprise diamond grit, or any other suitable coating. The coating may protect and/or repair the surface of the target during the annealing step.

The method may be a production step in the fabrication of a sensor. Preferably, the sensor may be a magnetic field sensor, an electric field sensor, and/or a temperature sensor. The method may be a production step in the fabrication of a quantum component, such as a quantum memory register, or a source of single photons.

According to a second aspect of the present invention there is provided a method of strain engineering of a crystal defect in a crystal lattice of a target comprising: positioning the target in a laser system; determining the location of the crystal defect in the crystal lattice; determining a region of the target to be modified based on the location of the crystal defect; applying a controlled optical pulse to the region of the target to locally damage the crystal lattice; and annealing the target to obtain from the damaged region of the crystal lattice a modified crystalline or amorphous structure, the modified crystalline or amorphous structure inducing a desired strain field at the crystal defect.

The method may include modifying or damaging the crystal lattice by nonlinear multi-photon absorption as described above in relation to the first aspect. The method may include using pulse energies the same as those described above in relation to the first aspect. Alternatively, the method may include using higher pulse energies e.g. greater than 15 nJ and towards the more typical levels of about 100 nJ which are used for modifying the crystal lattice to produce graphitic damage. In the second aspect, it may be desirable to create more damage of the lattice than is desirable in the first aspect, and therefore higher pulse energies may be used. Alternatively, for fine strain engineering, lower pulse energies may be used.

The target may comprise diamond, as described above. The method may include the step of modifying the crystal lattice by directing a focused laser beam to a specific region in the target, as described above. The method may include modifying a wavefront of the laser beam to cancel aberrations in the laser beam caused by the refractive index of the target, as described above in relation to the first aspect. The step of modifying the crystal lattice may include modifying the crystal lattice selectively at a certain depth, as described above. The method may include the selecting a pulse energy (PE) of the laser relative to a modification threshold (MT) of the target, as described above. The modified or damaged region of the crystal lattice may have a size of less than 200 nm, as described above. The method may comprise forming a two-dimensional or three-dimensional array or pattern of modified or damaged regions in the crystal lattice of the target, as described above. The target may be annealed in the manner described above. The step of annealing may include covering the target with a protective coating, as described above. The method may be a production step in the fabrication of a sensor or quantum component, as described above.

The method may include any and all of the optional features described above in relation to the first aspect of the invention. The method may include trapping a vacancy according to the first aspect of the invention, and then strain engineering the resulting crystal defect according to the second aspect of the invention. Aspects of the invention may be carried out one after another, or simultaneously.

The invention also extends to crystals which have been modified in accordance with any of the above described methods. It further extends to devices incorporating such crystals, such as sensors for magnetic fields, electric fields, or temperatures, quantum memory registers, sources of single photons of light, quantum components, and any other such devices which could benefit from the inclusion of such crystals.

Thus, the present invention, at least in preferred embodiments, may be seen to provide a method for modifying a crystal which allows:
(i) Creation of a controlled number of vacancies or creating of desired damage level to induce lattice strain. Control over the power, duration, and size of a laser pulse enables control over the amount and extent of modification of the crystal lattice, which translates into control over the number and location of fabricated vacancies.
(ii) High positional accuracy and small spatial distribution of modifications in three dimensions within a target material. The target material is only modified where the intensity of the laser pulse is sufficient to cause nonlinear multi-photon absorption. Further, since the method does not rely on the bombardment of a sample with ions, there is no scattering of ions to unexpected locations and no trail of collateral damage caused by entry of the ions into the sample.
(iii) Creation of vacancies anywhere in a bulk crystal. Bombardment techniques are limited by how deep they can penetrate without causing excessive damage. In contrast, the laser pulse of the present method can be focussed anywhere within the sample, and does not interact with the sample except where the intensity is large enough to cause modification.

(iv) Insensitivity of the process to surface quality, shape or impediment structures. The wavefront of the pulse can be controlled to counter aberrating effects of the sample surface. This allows the generation of controlled foci anywhere within the crystal.

(v) Rapid creation of complex patterns. The laser can be scanned or refocused with minimal difficulty compared to bombardment techniques.

(vi) Minimal residual lattice damage. Precise control over the laser pulse can ensure that only minimal damage occurs to the lattice. Only those regions where the intensity of the pulse is sufficient to cause nonlinear absorption with be modified.

The features and advantages of the invention will be further apparent from the following detailed description of an exemplary embodiment taken in conjunction with the figures.

LIST OF FIGURES

An embodiment of the invention will be described in detail below by way of example only and with reference to the following figures wherein:

FIG. 1A schematically depicts linear single photon absorption and shows a region of a laser focus in which such absorption may occur;

FIG. 1B schematically depicts nonlinear multi-photon absorption and shows a region of a laser focus in which such absorption may occur—the region is comparatively smaller than that for linear single photon absorption shown in FIG. 1A;

FIG. 3A shows the aberration of light rays caused by the rays being focused by a lens and subsequently entering a target material of different refractive index;

FIG. 3B shows a wavefront modified before focusing to cancel the aberration caused by subsequently entering a target material of different refractive index—a smaller region of a target material, particularly in a depth direction, may be modified by the pulse of FIG. 3B than by the pulse in FIG. 3A;

FIG. 4 shows a schematic of a laser system which could be used for fabricating trapped vacancies in a crystal lattice;

Figure 7A:
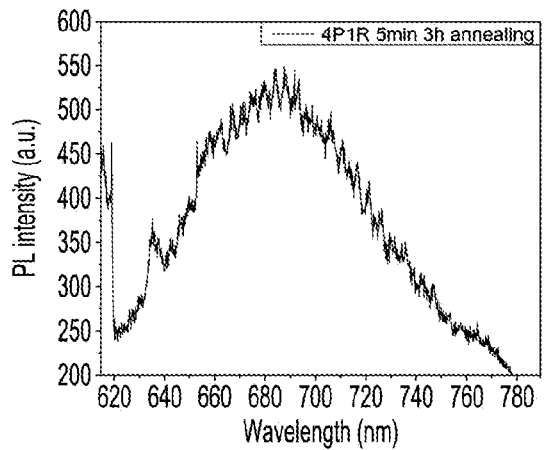
FIG. 7A shows the photoluminescence spectra of a first fabricated nitrogen-vacancy centre.
Figure 7B:
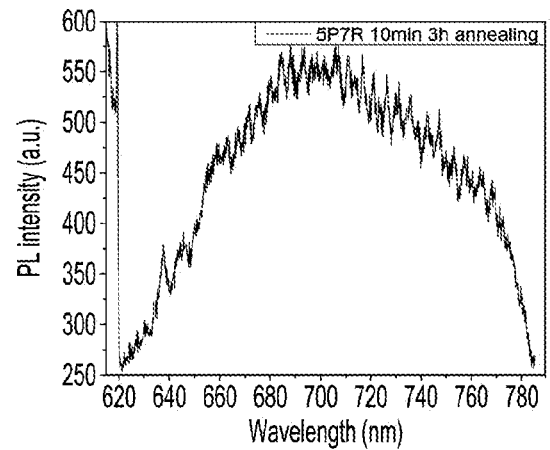
FIG. 7B shows the photoluminescence spectra of a second fabricated nitrogen-vacancy centre.
Figure 7C:
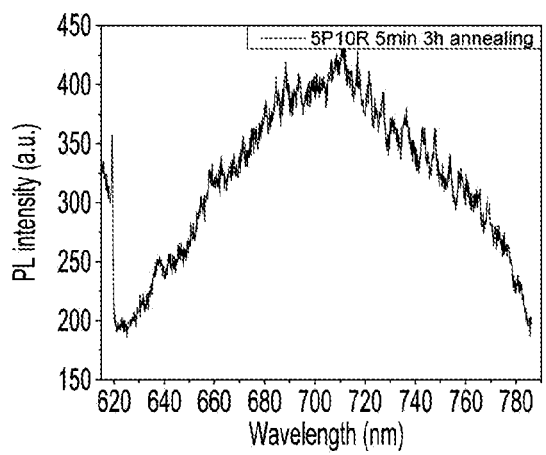
FIG. 7C shows the photoluminescence spectra of a third fabricated nitrogen-vacancy centre.
Figure 8A:
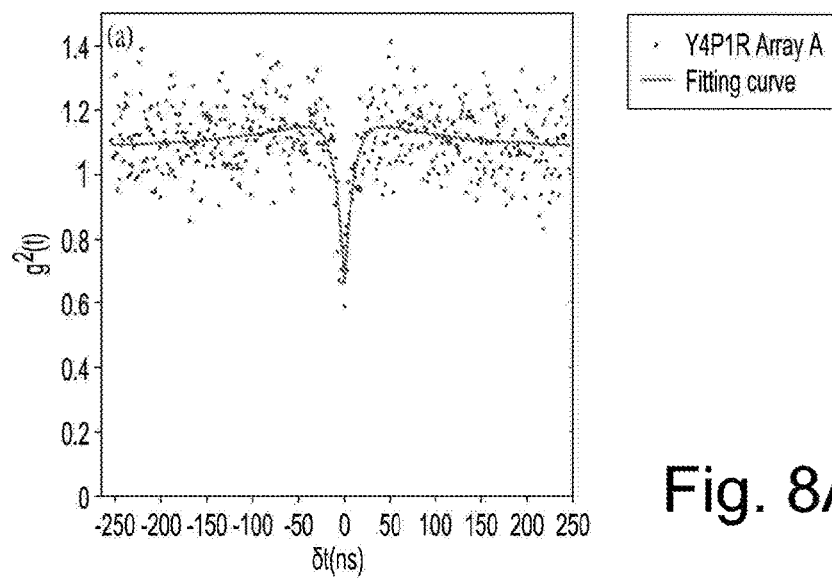
Figure 8B:
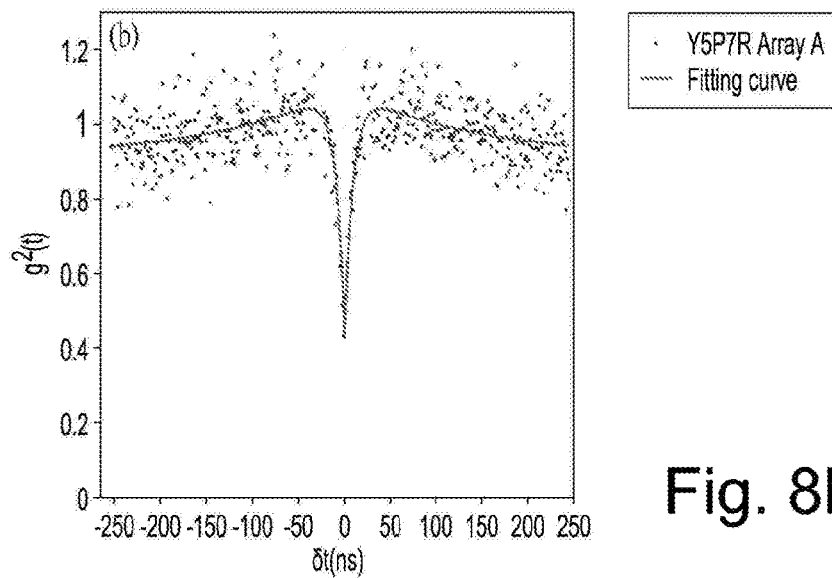
Figure 8C:
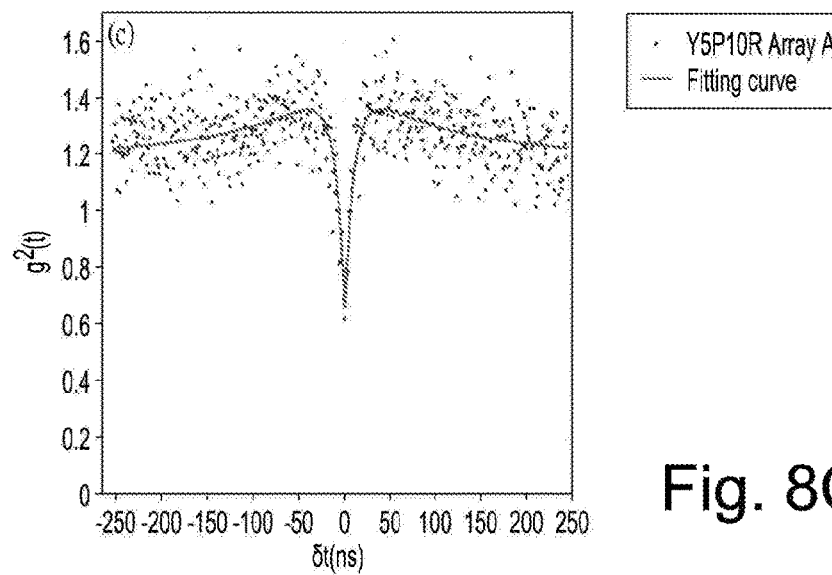

FIGS. 8A-C show Hanbury-Brown and Twiss measurements of photon correlations for the fabricated nitrogen-vacancy centres of FIGS. 7A-C, used for confirming that colour centres are present.

DETAILED DESCRIPTION

Lasers can be employed in manufacturing, with the tasks involving precision cutting and surface marking of materials. In such industrial processes, lasers typically have powers in excess of 10 W and pulse durations in the nanosecond regime. The laser is focused down to a spot that is typically in the range of tens of micrometres and the focus is scanned across a workpiece. The most common material interaction is the surface melting of materials, which are often metallic, with feature sizes in the range of tens of microns. Laser processing techniques using shorter pulsed lasers can provide more precise control over material modification at higher spatial resolution.

Figure 1A:
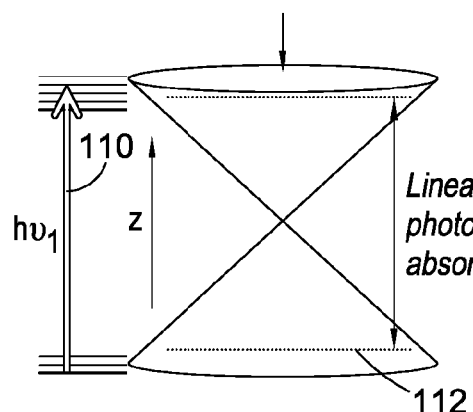
Figure 1B:
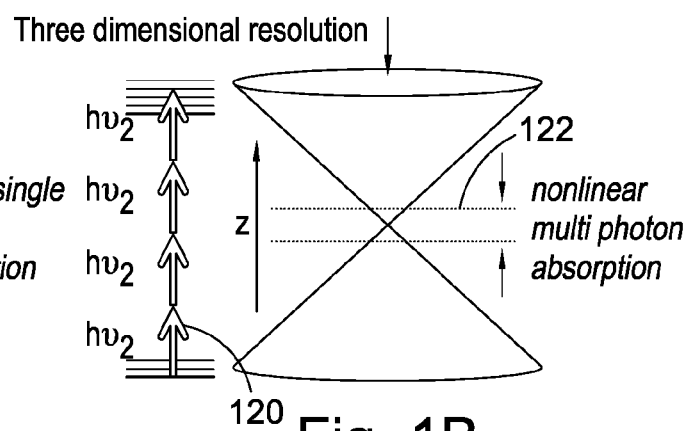

Lasers with shorter pulse durations (e.g. picosecond or femtosecond) create opportunities for finer precision fabrication at lower powers. This is of particular interest for photonic technologies and fabrication within transparent materials. Transparent materials have an optical bandgap that is larger than photon energies in the visible part of the spectrum. However, if the light intensity is large enough there becomes a realisable probability that multiple photons may be absorbed simultaneously in order to bridge the band gap (i.e. multi-photon, nonlinear absorption). FIG. 1B shows a schematic representation of nonlinear, multi-photon absorption compared to linear single photon (110) absorption shown in FIG. 1A. The same energy bandgap may be bridged by linear single photon (110) absorption, or by the simultaneous absorption of multiple photons of lower energy (120). For example, in FIG. 1B, four photons are absorbed, and this is thought to have been the mechanism that has been used in the examples of a diamond target discussed below.

The light intensities required for nonlinear multi-photon absorption may be achievable only at the highest intensity region (122) of a focus of a short pulsed laser beam. Outside of the focal region, the intensity is lower and the probability of multi-photon absorption is sufficiently small. The multi-photon absorption of energy from the laser can modify a crystal lattice and hence modify the absorbing material's properties. Thus, by relying on nonlinear multi-photon absorption, laser fabrication may be achieved which is highly localised in three dimensions to the focal region (122), with little or no modification to the surface or surrounding regions, where the probability of multi-photon absorption is negligible.

In contrast, when modifying a material using single photon (110) absorption, there may be sufficient intensity of the higher energy photons in a greater volume (112) of the focus to cause linear single photon absorption and hence modification of the crystal lattice. FIG. 1A shows that a greater region (112) (in the z-direction) of a laser focus may cause linear single photon modification of a crystal lattice, than for the region (122) of nonlinear multi-photon absorption shown in FIG. 1B. Therefore, nonlinear multi-photon absorption may allow more precise modification of a crystal lattice.

Another advantage of fabrication using ultrafast lasers (with picosecond or femtosecond pulse lengths) is that the pulse duration is shorter than the characteristic timescale for thermal diffusion. Therefore, the majority of the laser pulse energy can be delivered to the focal volume before diffusing away as heat. This enables fabrication of feature sizes that are limited to the focal volume of the focused laser beam, e.g. with sizes smaller than a micrometre in all directions. The fabricated feature sizes can be even smaller when "thresholding" occurs. FIG. 2 shows an example of thresholding.

Figure 2A:
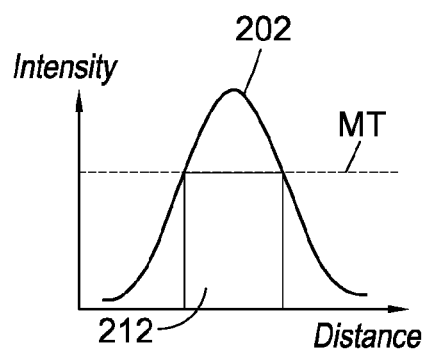
FIG. 2A shows a laser pulse with a greater proportion above the threshold for modification of a material than the pulse of FIG. 2B.
Figure 2B:
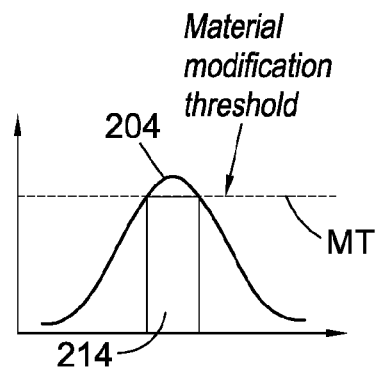
FIG. 2B shows a laser pulse with a smaller proportion above the threshold for modification of a material than the pulse of FIG. 2A—a smaller region of a target material may be modified by the pulse in FIG. 2B than by the pulse in FIG. 2A.

There is generally an intensity threshold over which permanent material modification follows multi-photon absorption. By reducing the energy of a laser pulse it is possible to modify a lattice just within the central region of the focus where the intensity is highest. In FIG. 2A, the higher intensity pulse (202) has a greater proportion of its volume above the threshold (MT) for material modification, and hence a greater volume (212) of material may be modified than for the lower energy pulse (204) shown in FIG. 2B, wherein a smaller proportion of the pulse intensity is greater than the material modification threshold (MT). Therefore, in FIG. 2B, a smaller volume (214) of the material may be modified (shown as the shaded area) than for the pulse (202) in FIG. 1A. Through careful control of the laser pulse energy the fabricated feature sizes may be reduced to the range of approximately 100 nm or less.

When an ultrafast laser beam is focused beneath the surface of e.g. diamond, the intensity can be large enough for nonlinear absorption. Diamond has a large optical bandgap of approximately 5.5 eV. Considering lasers with wavelengths in the near infra-red (where short pulsed lasers typically operate), the nonlinear absorption is predominantly a fourth order process (i.e. the simultaneous absorption of 4 photons). The nonlinear absorption is typically followed by avalanche ionisation, generating a dense plasma with sufficient energy to break down the diamond lattice. With sufficient pulse energy, the result is the conversion of the diamond into a graphitic phase, which is confined to the focal volume of the laser. By translating the focus within the diamond, either through beam scanning or motion of the diamond sample, it is possible to generate continuous graphitic tracks or an array of point-like graphitic features in three dimensions. Through careful control of the laser pulse energy, it is also possible to limit the conversion of diamond into graphite, instead leaving a region where the overall diamond lattice is largely maintained but where additional vacancies are present. Therefore, controlled laser pulses can be used to modify (damage) a specific region of a diamond lattice in order to generate vacancies therein, or to engineer strain. A single laser pulse may be used to generate a single lattice vacancy, or a single pulse may generate a plurality of vacancies.

A problem that may be encountered in laser fabrication within transparent materials is the introduction of optical aberrations when focusing through an interface with a mismatched refractive index. For example, this may occur at the top surface of a sample which is not index matched (has a different refractive index) to the immersion medium of the focusing lens. Refraction at the interface, approximately following Snell's law, leads to a redirection of rays within the sample such that they no longer all overlap at the desired focus within the sample. FIG. 3A shows a schematic of the scenario where aberration of the rays (316) is caused as the rays enter the sample (314). The result is that they no longer all meet at the intended focal point, and instead spread out to generate more loosely focused region of lower intensity (318). The intensity of the aberrated focus is also shown in FIG. 3A. This spherical aberration increases in magnitude with increased focussing depth or numerical aperture (NA). This may lead to a loss in efficiency, resolution and control over the fabrication process.

Spherical aberrations are particularly severe when focussing into diamond, due to the large refractive index of diamond. For accurate laser processing at the highest resolution (high NA), the aberrations would limit the fabrication depth to a few micrometres beneath the diamond surface.

However, in one embodiment of the present method, it is possible to cancel aberrations which are introduced when focussing beneath the surface of a transparent material by 'pre-aberrating' the laser beam. For full flexibility in the fabrication, an adaptive optical element (AOE) may be used to impose a phase distribution on the laser beam which is equal and opposite to the aberration introduced at the sample surface.

FIG. 3B shows a schematic of a flat wavefront (320) being modified by an AOE (322) to form a corrected wavefront (324). Note that the rays (326) of the corrected wavefront (324) are oriented differently to those (316) of the flat wavefront (310) shown in FIG. 3A. In FIG. 3B the rays (326) of the corrected wavefront are then focussed by the lens (328) and subsequently refracted by the sample surface (330) in order to meet at a desired focus (332) within the sample. The intensity of the corrected focus is also shown in FIG. 3B, and is more localised than that of FIG. 3A. Typical AOEs include liquid crystal spatial light modulators (SLMs), deformable mirrors, or membrane deformable mirrors. These elements can change their phase profile to modify an incident wavefront and accommodate aberration-free focussing of the laser beam to different depths within a sample.

Through the use of AOEs, aberrations introduced at the diamond surface may be effectively cancelled, enabling accurate laser fabrication are greater depths, e.g. at least 220 µm. When machining continuous graphitic tracks beneath the diamond surface, the correction of aberrations using AOEs can lead to orders of magnitude reduction in the resistivity of the tracks, indicating a far more efficient conversion from diamond to a graphitic phase.

In one embodiment of the present method, laser writing using adaptive optics may be used to produce vacancies for colour centre formation and provide many desirable features. A description follows of how the described method provides such features. The scope of applications is also discussed.

The spatial localisation delivered by ultrashort pulsed laser processing provides the ability to precisely choose the position of fabricated colour centres. This can be important for device functionality, for example if it is necessary to position a colour centre within an optical cavity mode, or in an array to accommodate electrodes. It may also be necessary to create a colour centre near to another existing structure in the material which needs to be protected from damage. Adaptive optical correction of aberrations when focussing into materials can be key when aiming to create colour centres with a laser beam. The AOE correction provides accurate positioning of the laser fabrication in 3D. It also reduces the size of the focal volume to give better positioning accuracy for created vacancies and therefore also for fabricated colour centres. Furthermore, since fine control over the laser pulse energy is required for colour centre creation, aberration correction ensures that the same laser pulse energy can be used at all depths, simplifying the processing conditions.

The controlled localisation of damage also permits engineering of colour centre properties via the local strain field. It is known that local strain can lead to changes in the energies and character of both optical transitions and spin transitions of colour centres, and so strain engineering of defects can be a powerful tool in optimising their properties. Control at the single defect level is especially powerful as it may allow, for example, colour centres to be tuned into resonance with each other allowing quantum interference between their emitted photons. Laser processing may provide a convenient means by which such strain engineering can be carried out. Laser induced damage may result in an average expansion or contraction of the processed volume, applying stress to the surrounding material and generating a strain field that can extend over long distances in the undamaged lattice. High precision in the localisation and distribution of the damaged region therefore translates directly to high precision in the control of local strain experienced by a colour centre nearby and a results in a high degree of control over its properties.

The nonlinear nature of laser damage is a useful tool in the controlled localisation of damage. In particular it allows damage to be created far below the diamond surface without affecting the shallower material, since it is only at the focus of the laser beam in the diamond that sufficient optical intensity exists to create any damage at all.

By adjusting the focus of the laser in the material, full 3D writing of modification or damage can therefore be achieved. This capability allows detailed distributions of colour centres or complex strain patterns to be generated, providing a large parameter space for engineering of colour centre properties.

Control over the laser intensity translates to control over the amount of damage created in the crystal. It is likely that vacancy generation is a largely stochastic process, such that the number of vacancies generated per volume in the crystal follows a Poissonian probability distribution. This may place a limit on the extent to which an exact desired number of vacancies can be created, but nevertheless it should be possible to identify on average the number of vacancies and other defects that a particular laser pulse intensity would create. To a large extent such calculations may rely on the uniformity and purity of the crystal to be processed (since any defects already present are likely to absorb the laser radiation more strongly, and therefore act as strong sources of heat generation). In the highest purity material, it might be expected that there will be in most cases no defects present within a focal volume, providing a high degree of reproducibility between processing iterations.

In one embodiment, the described method for the laser writing of colour centres in diamond uses single pulses of carefully controlled energy to create structural disruption in the diamond lattice. The nonlinear nature of the interaction dictates that such structural modifications are highly localised in three dimensions.

FIG. 4 shows a system (400) for carrying out the described method according to one embodiment, which uses a regeneratively amplified Ti:Sapphire laser (410). The pulses of wavelength 790 nm may have a duration of about 80 fs leaving the laser. The pulse duration at the focus may be closer to about 300 fs due to dispersion within the optical system. The laser beam may be expanded onto a liquid crystal phase only spatial light modulator (SLM) in order to control its phase, and can then be imaged onto the back aperture of a 60× 1.4NA oil immersion objective. The phase pattern displayed on the SLM may be controlled to remove system and specimen induced aberrations, as described earlier. The SLM phase pattern can be determined experimentally by minimising the laser pulse energy required for visible modification of the diamond lattice.

The laser may then be directed to a target (420) of diamond, and single pulses from the laser may be focussed at a depth of e.g. 50 µm into the diamond. The pulse energy before the objective lens may be varied between 2 nJ and 13 nJ to invoke varying degrees of disruption to the lattice. Some modifications may be optically visible but the majority may not be. The size of the modified features may be within the diffraction limit of the microscope used for inspection and may be less than or equal to about 400 nm in lateral dimensions.

The laser fabrication may be done in a commercial high purity CVD diamond with nitrogen density less than 5 ppb. The NV− centres density of the diamond can be investigated by a scanning confocal microscope before laser fabrication. There may only be 2-3 native single NV− centres within 100 by 100 µm$^2$ in average. As a result, the native NV− centres can be labelled in advance and used as a benchmark for comparisons.

Following laser modification of the target material, the fabricated diamond sample can be annealed at about 900 degrees Celsius for about 3 hours with high purity nitrogen gas. A temperature of about 900 degrees Celsius is high enough to form stable NV centres. The pure nitrogen environment can prevent oxidization on the surface of the diamond sample. Annealing allows the vacancies generated during the laser fabrication stage to migrate within the crystal lattice. This migration is random, and the vacancy needs to chance across a vacancy trapping element (in this case nitrogen) within the crystal lattice to form a stable nitrogen-vacancy and colour centre. During this stage, some of the fabricated vacancies may be repaired and the crystal lattice may recover to a substantially unmodified state. However, some vacancies may migrate close to a nitrogen impurity and form a stable colour centre. The probability of forming such a colour centre may be such that only one is formed per each modified region of the target material.

The migration of vacancies can also allow the migration of other impurities within the crystal lattice. Other impurities may therefore combine to form crystal defects, facilitated by the migration of vacancies.

Figure 5A:
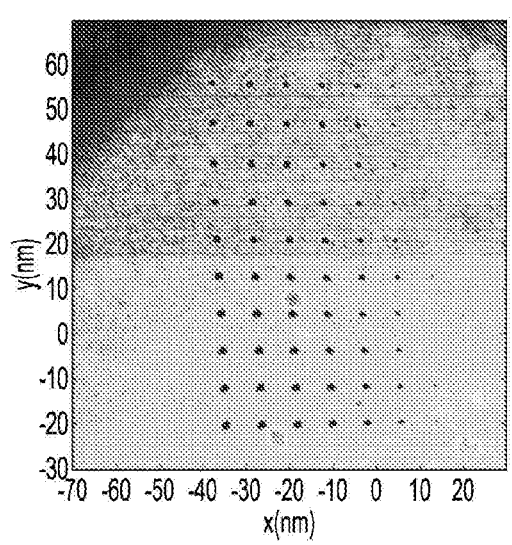
FIG. 5A shows the photoluminescence before annealing of an exemplary target material modified using the apparatus of FIG. 4—the modified regions are visible as bright points.
Figure 5B:
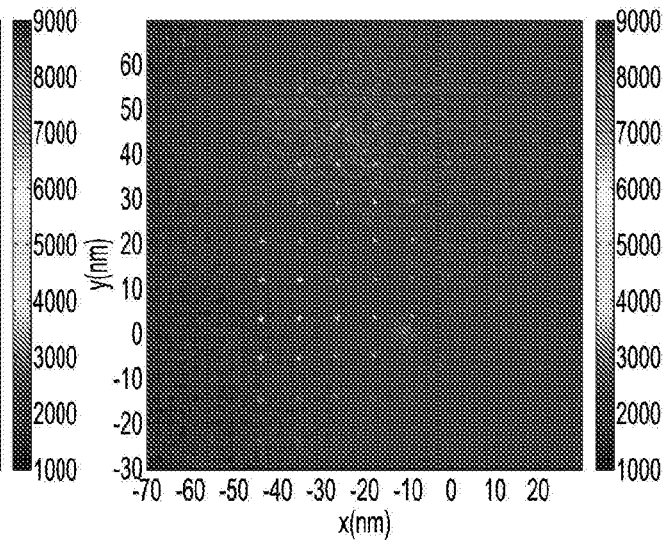
FIG. 5B shows the photoluminescence after annealing of the target material of FIG. 5A—the modified regions are visible as dots and the annealing has repaired some of the modification of the target material.

In order to test the described method for fabricating trapped vacancies, a sample was prepared according to the embodiment of the method described above. The photoluminescence (PL) intensities of the fabricated features were then investigated using the confocal microscope before and after annealing. FIG. 5A shows the PL of some fabricated features before annealing. Only features which were generated by a laser energy greater than about 9 nJ can be observed in the PL image before annealing, indicating that 9 nJ may be the lowest laser energy to create optically detectable damages, at least in the exemplary apparatus and for the target tested. FIG. 5B shows the PL of the same fabricated features after annealing. The leftmost columns in FIGS. 5A and 5B show features which were generated by a laser energy of about 13.6 nJ. After annealing, the fabricated features become dimmer and the features which were created by laser energies of 9.1 nJ (the sixth column from left) and 9.8 nJ (the seventh column from left) disappeared, as shown in FIG. 5B, implying the damages were healed to some extent by the annealing process.

Figure 6A:
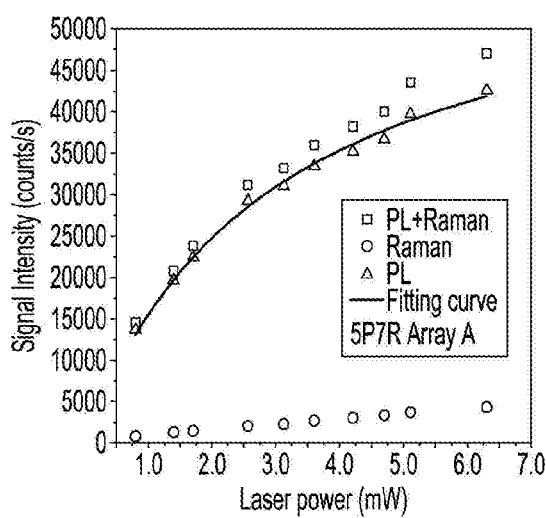
FIG. 6A shows a typical saturation curve for the photoluminescence intensity of a fabricated nitrogen-vacancy centre in diamond.

FIG. 6 shows power dependent PL intensity and spectrum measurements which were conducted on the sample of FIG. 5 to verify that the damage features therein were transformed to NV– centres. The dependence of emission intensity on excitation power for NV– centres shows a clear saturation behaviour at powers of order 1 mW. In contrast, excitation power dependence curves of damage defects are typically linear. The power dependence measurement may therefore be used to test for the conversion of damaged regions of the material into colour centres.

A characteristic zero phonon line (ZPL) emission at 637 nm must be observed in the spectrum (see FIG. 7) to confirm that a feature is indeed a NV– centre (although the absence of the ZPL does not confirm that it is not NV–). All native NV– centres in the present example were labelled before annealing and were not close to the fabrication features, so the NV– centres which were found in the damage features were created by the disclosed laser fabrication method. Once the NV– centres were found, Hanbury-Brown and Twiss (HBT) measurements were used to measure the autocorrelation function thereof to identify the number of created NV– centres. The normalized autocorrelation counts would be lower than 0.5 at $\delta t=0$, if the source were a single NV– centre.

Figure 6B:
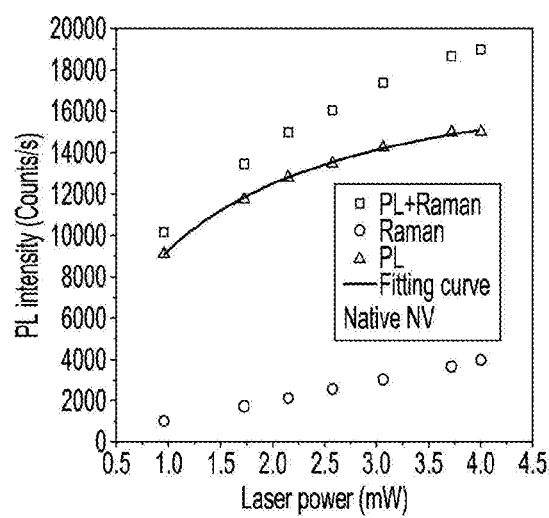
FIG. 6B shows a typical saturation curve for the photoluminescence intensity of a native nitrogen-vacancy centre in diamond.

At least three of the features shown in FIGS. 5A and B were transformed to NV– centres after annealing by the disclosed method. One feature was created with a laser pulse of about 11.3 nJ and is labelled as 4P1R. Two features were created with 10.6 nJ, labelled as 5P7R and 5P10R. The fluorescence photon count rate of the created NV– centres was about 17,000 counts/s under 1 mW 532 nm excitation, and the saturation behaviour of the PL intensity can be observed clearly in FIG. 6A. FIG. 6B shows the excitation power dependence of a native NV– centre. The count rate of the created NV– centre was higher than that of the native NV– centre, 10000 counts/s with 1 mW excitation, because there may still have been some residual defects, which were not completely annealed out.

Figure 7D:
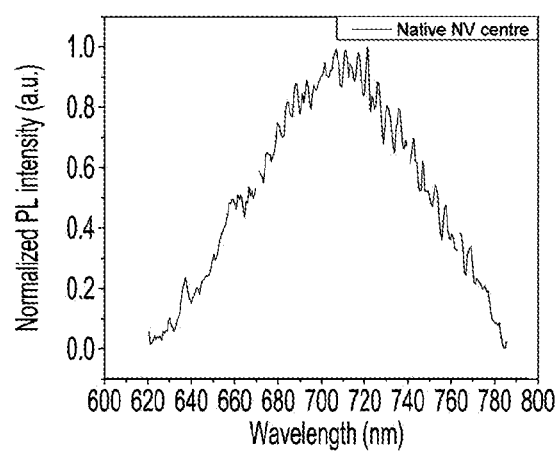
FIG. 7D shows the photoluminescence spectra of a native nitrogen-vacancy centre.

FIGS. 7A-C show the PL spectra of the created NV– centres and FIG. 7D shows that of a native NV– centre at 300K and under 532 nm excitation. FIG. 7A is the spectrum of the created NV– centre 4P1R. FIGS. 7B and C show the spectra of 5P7R and 5P10R, respectively. FIG. 7D is the spectrum of a native NV– centre. The 637 nm ZPL is observed clearly in the spectra of the three created NV– centres, but the PL intensities of both 5P7R and 5P10R decrease more slowly around 740 nm likely due to residual vacancy complexes.

HBT measurements of the photon autocorrelation function for the created NV– centres were recorded with 532 nm excitation of 1 mW and the results are shown as scatter graphs in FIG. 8. The anti-bunching dip of 4P1R is about 60.7% (FIG. 8A) which may indicate that there are two NV– centres within the focal point. The characteristic dip of 5P7R is about 48.4% (FIG. 8B), indicating it is a single NV– centre. Note that the characteristic dip of 5P7R is not near to zero at $\delta t=0$, likely because of residual vacancies. The anti-bunching dip of 5P10R is about 54.6%. 5P10R may be a single NV– centre, if taking the residual vacancies emission into account.

Using an embodiment of the present method, the creation of single nitrogen-vacancy defects using laser processing and annealing according to claim 1 has been described and demonstrated. A target was first modified using nonlinear multi-photon absorption in order to fabricate vacancies therein. The target was then annealed to allow the vacancies to migrate and combine with a nitrogen atom and thereby form a colour centre in a desired location within the target. The method also shows that a region of the crystal can be modified, which induces strain in the surrounding crystal according to claim 30. The methods, devices, and systems of the present disclosure, as described above and shown in the drawings, therefore allow the fabrication of trapped vacancies in a crystal lattice. While the apparatus and methods disclosed herein have been shown and described with reference to an exemplary embodiment, those skilled in the art will appreciate that changes and/or modifications may be made thereto without departing from the scope of the subject disclosure as defined by the appended claims.

The invention claimed is:

1. A method of fabricating a trapped vacancy in a crystal lattice of a target comprising:
   positioning the target in a laser system comprising a laser, the target containing vacancy trapping elements within the crystal lattice;
   using a pulsed laser beam produced the laser to create a lattice vacancy in the crystal lattice within the target; and
   annealing the target to cause the lattice vacancy to migrate and be captured by a vacancy trapping element to form the trapped vacancy in the crystal lattice,
   wherein using the pulsed laser beam produced by the laser to create the lattice vacancy comprises:
   determining a position for the lattice vacancy within the crystal lattice;
   focusing the pulsed laser beam at the determined position within the crystal lattice;
   selecting a pulse energy of the pulsed laser beam that causes nonlinear multi-photon absorption by the crystal lattice and creates the lattice vacancy; and
   operating the laser to provide the pulse energy within an energy range to create the lattice vacancy within the crystal lattice only within a localized volume of width less than 1 micrometer.

2. The method of claim 1 wherein the laser is operated at a central wavelength such that an absorbed photon has energy that is less than a bandgap of the target.

3. The method of claim 1 wherein the pulse energy of the pulsed laser beam entering the target is in a range between 5 nJ and 15 nJ.

4. The method of claim 1 wherein the vacancy trapping elements are present at a concentration of less than 1 part per million.

5. The method of claim 1 wherein the vacancy trapping element is nitrogen; or wherein the vacancy trapping element is silicon; or wherein the vacancy trapping element is germanium.

6. The method of claim 1 wherein the vacancy trapping elements are deposited during fabrication of the target.

7. The method of claim 1 wherein the trapped vacancy forms part of a colour centre.

8. The method of claim 1 further comprising modifying a wavefront of the pulsed laser beam to cancel aberrations in the pulsed laser beam caused by a refractive index of the target.

9. The method of claim 1 wherein the method includes the step of selecting the pulse energy of the laser relative to a modification threshold of the target in order to reduce an effective beam area for modifying the crystal lattice.

10. The method of claim 1 wherein a modified region of the crystal lattice has a size of less than 200 nm.

11. The method of claim 1 wherein the target is diamond.

12. The method of claim 1 wherein the target is one of: silicon carbide or silicon.

13. The method of claim 1 wherein the annealing comprises heating the target to between 800-1400° C. for a period of 15 minutes to 24 hours.

14. The method of claim 1 wherein the method further comprises forming a two-dimensional or three-dimensional array or pattern of trapped vacancies in the crystal lattice of the target.

15. The method of claim 1 wherein the method is a production step in fabrication of a sensor.

16. The method of claim 1 wherein the method is a production step in fabrication of a quantum component.

17. The method of claim 1 wherein a pulse duration is shorter than a characteristic timescale for thermal diffusion in the target.

18. The method of claim 1 wherein the laser is a picosecond or femtosecond laser.

19. The method of claim 1, wherein using the pulsed laser beam produced the laser to create the lattice vacancy in the crystal lattice within the target causes fourth-order or higher nonlinear multi-photon absorption in the crystal lattice.

20. The method of claim 1 wherein the method further comprises controlling laser operation so that the target is free of damage in a region around the trapped vacancy following annealing.

21. The method of claim 1 wherein using the pulsed laser beam produced the laser to create the lattice vacancy in the crystal lattice within the target comprises modifying the crystal lattice selectively at a depth of greater than 5 microns from a surface of the target.

22. The method of claim 1 wherein using the pulsed laser beam produced the laser to create the lattice vacancy in the crystal lattice within the target comprises modifying the lattice so as to engineer a strain field about at least one specific trapped vacancy in order to modify its properties.

23. The method of claim 1 wherein a target surface is not affected or modified.

24. The method of claim 1 wherein optical properties of the target remain unchanged except where the trapped vacancy is fabricated.

25. The method of claim 1 wherein annealing the target causes healing of lattice vacancies which are not trapped.

26. A method of fabricating a trapped vacancy in a crystal lattice of a target comprising:
    positioning the target in a laser system comprising a laser, the target containing vacancy trapping elements within the crystal lattice;
    using a pulsed laser beam produced the laser to create a lattice vacancy in the crystal lattice within the target; and
    annealing the target to cause the lattice vacancy to migrate and be captured by a vacancy trapping element to form the trapped vacancy in the crystal lattice,
    wherein using the pulsed laser beam produced the laser to create a lattice vacancy in the crystal lattice within the target comprises:
    determining a position for the lattice vacancy within the crystal lattice;
    focusing the pulsed laser beam at the determined position within the crystal lattice;
    selecting a pulse energy of the pulsed laser beam that causes nonlinear multi-photon absorption by the crystal lattice and creates the lattice vacancy; and
    operating the laser to provide the pulse energy within an energy range to create the lattice vacancy within the crystal lattice only within a localized volume of width less than 1 micrometer,
    wherein the laser is operated at a central wavelength such that an absorbed photon has an energy that is less than a bandgap of the target.

* * * * *